(12) United States Patent
Yamamoto et al.

(10) Patent No.: US 6,700,852 B1
(45) Date of Patent: Mar. 2, 2004

(54) INFORMATION RECORDING MEDIUM WITH RECORDING FILM WITH COBALT OXIDE CRYSTALLINE PARTICLES, AND INFORMATION RECORDING DEVICE INCLUDING THE SAME

(75) Inventors: Hiroki Yamamoto, Hitachi (JP); Takashi Naito, Hitachiohta (JP); Ken Takahashi, Tokai-mura (JP); Sumio Hosaka, Nishitama-gun (JP); Motoyasu Terao, Nishitama-gun (JP); Fumiyoshi Kirino, Tokyo (JP); Eiji Koyama, Tsuchiura (JP); Hiroki Kuramoto, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 528 days.

(21) Appl. No.: 09/585,294

(22) Filed: Jun. 2, 2000

(30) Foreign Application Priority Data

Jun. 4, 1999 (JP) .......................................... 11-157479

(51) Int. Cl.$^7$ ................................................. G11B 7/00
(52) U.S. Cl. ...................................... 369/100; 369/288
(58) Field of Search ................... 369/100, 275.1–275.2, 369/275.4, 283–284, 288; 430/270.12–270.13

(56) References Cited

U.S. PATENT DOCUMENTS

| 4,839,208 | A | * | 6/1989 | Nakagawa et al. ...... 369/288 X |
| 4,865,948 | A | | 9/1989 | Masumoto et al. |
| 5,420,845 | A | * | 5/1995 | Maeda et al. ................ 369/100 |

FOREIGN PATENT DOCUMENTS

| EP | 506085 | 9/1992 |
| EP | 527551 | 2/1993 |
| EP | 915458 | 5/1999 |
| EP | 0915458 | 5/1999 |
| GB | 1571948 | 7/1980 |
| JP | 7-98484 | 4/1995 |

OTHER PUBLICATIONS

Database WPI, Section CH, Week 199523, Derwent Publications AN 1995–175792 & JP 07 098484 11 Apr. 1995.

* cited by examiner

Primary Examiner—W R Young
(74) Attorney, Agent, or Firm—Antonelli, Terry, Stout & Kraus, LLP

(57) ABSTRACT

An information recording medium capable of high-density recording and accurate reproduction and also capable of repeated recording and reproduction, an information recording device that employs the information recording medium has a Co—Si oxide thin film 1 constructed such that columnar crystals 2 are separated by an intergranular phase 3 which contains $SiO_2$ having a lower coefficient of thermal conductivity than the columnar crystals 2. Therefore, the intergranular phase 3 prevents heat transfer from one columnar crystal 2 to another. In addition, the intergranular phase 3 separates columnar crystals 2 from each other, so that the crystalline structure of each columnar crystal 2 is not affected by its adjacent columnar crystal 2. The advantage of such construction is that the columnar crystals 2 do not undergo phase transformation except for those which were given energy necessary for phase transformation directly from the laser beam, and hence columnar crystals 2 overheated by the laser beam do not affect their adjacent columnar crystals. Thus it is possible to accurately form recording pits whose mark length is smaller than the laser beam diameter.

8 Claims, 18 Drawing Sheets

40nm

INFORMATION RECORDING MEDIUM WITH RECORDING FILM WITH COBALT OXIDE CRYSTALLINE PARTICLES, AND INFORMATION RECORDING DEVICE INCLUDING THE SAME

BACKGROUND OF THE INVENTION

One way to increase the recording density of an optical disk is to employ a blue laser having a short wavelength (410 nm), as mentioned in Japanese Patent Laid-open No. 127174/1996. Another way to increase the recording density of an optical recording medium is to use an optical recording film of sulfide, oxide, or carbonyl of such metal as copper, platinum, gold, lead, chromium, molybdenum, and iron, which is capable of super-resolution, as mentioned in Japanese Patent Laid-open No. 267078/1994. The information recording layer of an optical disk may be formed from a material which changes from the crystalline phase into the amorphous phase, and vice versa, as mentioned in Japanese Patent Laid-open No. 198709/1997.

BRIEF SUMMARY OF THE INVENTION

There is a continuing demand for an information recording medium capable of high density recording. A recording density as high as 1 Tbit/inch$^2$ is required. One way to achieve this object is to employ a laser beam with a short wavelength which gives a spot having a small diameter. Increasing the recording density in this way is difficult because the reduction of laser wavelength is limited. A substantial increase in recording density is not expected from the recording system by super-resolution because it is only possible to reduce the laser beam diameter by half.

The present invention relates to an information recording medium and an information recording device. More particularly, the present invention relates to an information recording medium and an information recording device capable of high density recording.

It is another object of the present invention to provide an information recording medium and an information recording device capable of high density recording, accurate reproduction, and repeated recording and reproduction.

According to the present invention, the information recording medium has a recording film in which crystal grains are separated by an intergranular phase which is at the boundary between crystal grains. The advantage of this constitution is that the crystal grains undergo phase transformation in a range smaller than the beam diameter in the vicinity of the beam center and the intergranular phase prevents other crystal grains from being affected. The phase change in this manner accurately forms recording pits whose length is smaller than the laser beam diameter. Thus the information recording medium has a very high recording density.

According to the present invention, the crystal grains contain an oxide of Co, V, Mn, Fe, or Cu, and the intergranular phase contains an oxide of Si, Ti, Zn, Pb, or Bi, so that crystal grains undergo phase transformation upon irradiation with a laser beam and the intergranular phase prevents crystal grains from being affected. The crystal grains should preferably be those which undergo phase transformation between $Co_3O_4$ and $CoO$, $Vo_3O_5$ and $V_2O_3$, $Mn_2O_3$ and $Mn_3O_4$, $Fe_2O_3$ and $Fe_3O_4$, or $CuO$ and $Cu_2O$. The crystal grains should preferably be uniform in particle diameter. $SiO_2$ existing in the grain boundary prevents the crystal grains from affecting other crystal grains, thereby contributing to high density recording.

The present invention is also directed to an information recording device which is made up of a recording film and an optical head, said recording film being composed of crystal grains and an intergranular phase existing at the grain boundary, said optical head being so designed as to supply the recording film with a near-field light whose diameter is made smaller than the wavelength of the laser beam. The fact that the optical head emits a laser beam of small diameter toward the recording film causes the phase transformation of crystal grains to take place in a small region, thereby permitting shorter recording pits to be made accurately. In addition, the fact that the intergranular phase prevents crystal grains from affecting other crystal grains permits the high density recording and accurate reproduction of information.

DETAILED DESCRIPTION OF THE INVENTION

The present inventors found that a thin film of Co—Si oxide is suitable for high density recording which has never been attained by conventional recording film. A mention is made below of the thin film of Co—Si oxide produced by the present inventors. An example of the thin film of Co—Si oxide produced by the present inventors is shown in FIG. 1 (which is a photograph of the film surface).

Figure 1:
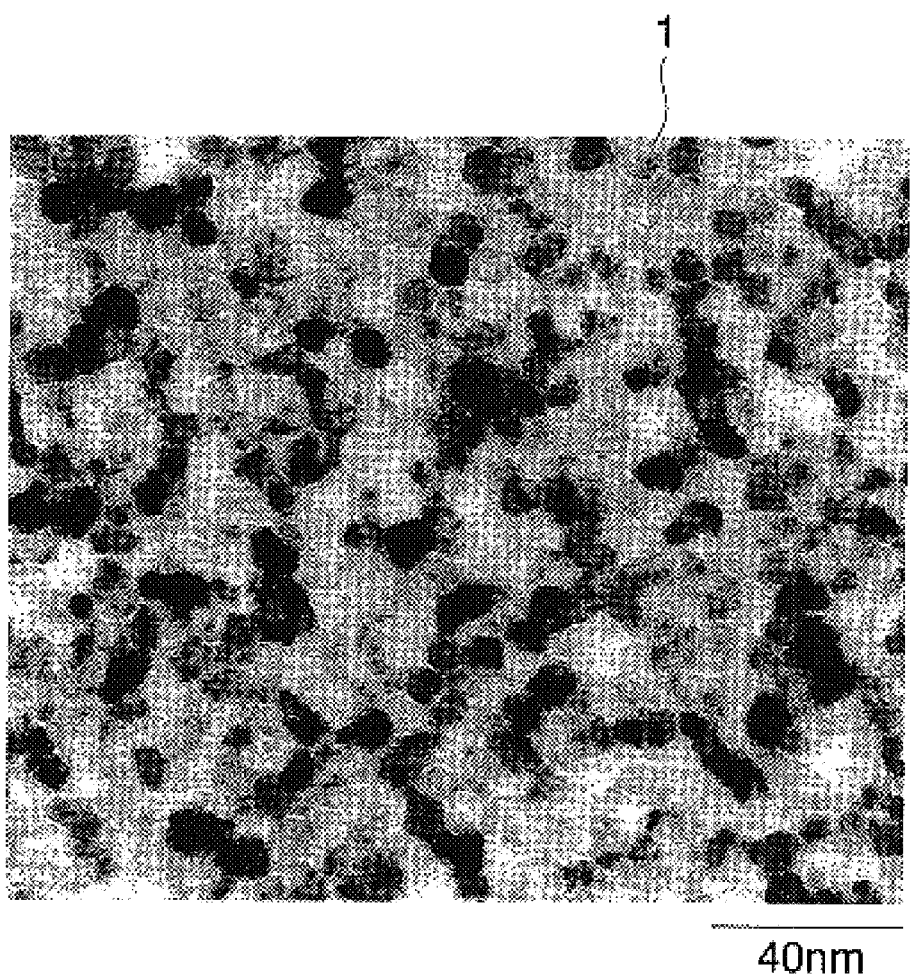
FIG. 1 is a photograph of the surface of Co—Si oxide thin film 1.
Figure 2:
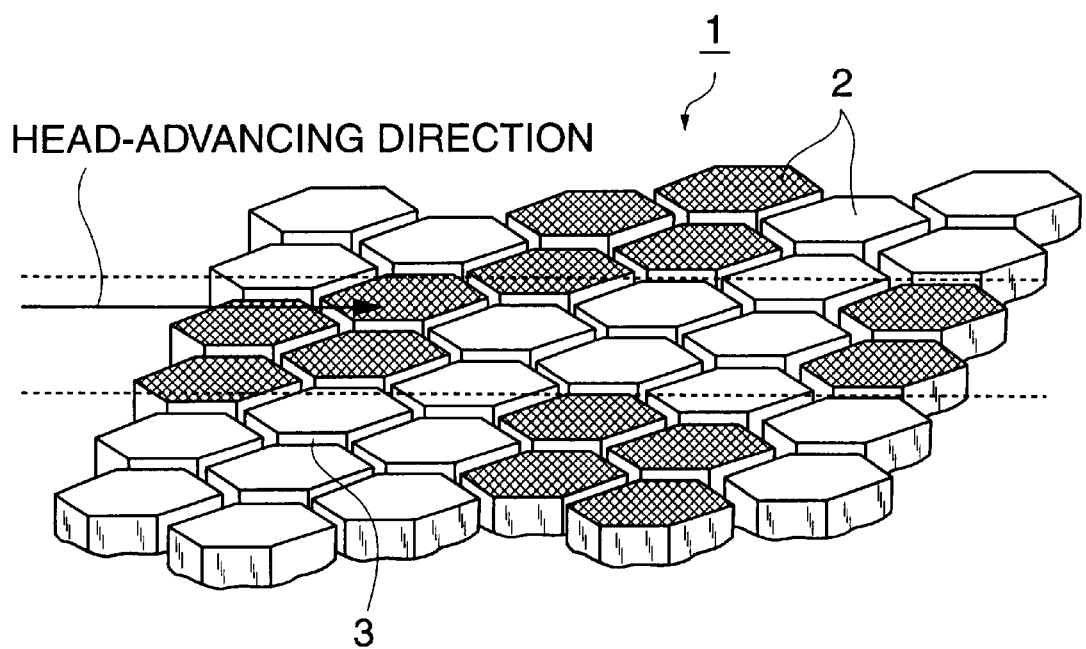
FIG. 2 is a schematic diagram of the Co—Si oxide thin film 1 shown in FIG. 1.

FIG. 2 is a schematic diagram of the Co—Si oxide thin film 1 shown in FIG. 1. The Co—Si oxide thin film 1 is formed on a glass substrate (not shown) by sputtering from a sintered target which is a 1:9 mixture of $SiO_2$ and CoO.

The Co—Si oxide thin film immediately after its formation was examined by X-ray diffraction (XRD) and transmission electron microscopy (TEM). It was found that the thin film consists of columnar crystals 2 of cobalt oxide which have densely grown in the direction perpendicular to the plane of the glass substrate and the columnar crystals 2 are all composed of $Co_3O_4$ and are separated from one another by $SiO_2$ which has precipitated in the grain boundary. In the present invention, the crystals which have precipitated in the grain boundary between the columnar crystals 2 are referred to as the intergranular phase 3.

It was found that the columnar crystals 2 have an average particle diameter of about 10 nm, with the standard deviation ($\sigma$) being about 1.5 nm which indicates the variance of particle diameters. (The particle diameter of the columnar crystal 2 was obtained by measuring the area of each columnar crystal 2 in the film surface and then calculating the diameter of a circle having the thus measured area.) In other words, the columnar crystals are uniform in particle diameter. The columnar crystals 2 in the film surface are mostly hexagonal and partly pentagonal, heptagonal, or octagonal. The intergranular phase 3 observed in the film surface is about 1 nm wide.

The Co—Si oxide thin film 1 was irradiated with a laser beam to examine the transformation of the columnar crystals 2 and intergranular phase 3 in the following manner.

A 20-mW laser beam was applied to the Co—Si oxide thin film (composed of columnar crystals 2 of $Co_3O_4$) immediately after its formation. The part irradiated with the laser beam was examined by TEM and electron diffraction. It was found that the columnar crystals 2 underwent phase transformation from $Co_3O_4$ into CoO. The columnar crystals 2 not irradiated with the laser beam remained to have the phase of $Co_3O_4$. A probable reason for this transformation is that $Co_3O_4$ is stable at low temperatures and CoO is stable at high temperatures thermodynamically and hence $Co_3O_4$ precipitates immediately after the film has been formed, but $Co_3O_4$ undergoes phase transformation into CoO as it is irradiated with a laser beam (hence locally heated to 900° C. or above) and then cooled rapidly as laser irradiation is suspended. The columnar crystals 2 which had undergone phase transformation into CoO did not change any longer even though it was further irradiated with a 20-mW laser beam.

The columnar crystals 2 of $Co_3O_4$ remained unchanged when irradiated with a 6-mW laser beam, whereas the columnar crystals of CoO underwent phase transformation into $Co_3O_4$ when irradiated with a 6-mW laser beam. The both columnar crystals of $Co_3O_4$ and CoO remained unchanged in crystal phase when irradiated with a 2-mw laser beam. The intergranular phase 3 remained unchanged when irradiated with a laser beam. It was found as mentioned above that the columnar crystals 2 undergo phase transformation through oxidation and reduction depending on the intensity of the laser beam applied to them.

It was found that upon irradiation with a laser beam, the Co—Si oxide thin film 1 gives rise to recording pits with a diameter smaller than that of the laser beam applied. This is explained in the following.

The Co—Si oxide thin film 1 was irradiated with an excimer laser having a wavelength of 190 nm. The laser beam was passed through a calcium fluoride lens (having an NA of 0.6) so that the beam diameter was narrowed down to 265 nm. In the initial state, the columnar crystals 2 were composed entirely of $Co_3O_4$. A 20-mW laser beam was applied to bring about phase transformation from $Co_3O_4$ into CoO. A 2-mW laser beam was applied to read out information or to confirm the phase transformation from $Co_3O_4$ into CoO by measuring the reflectivity.

Figure 3:
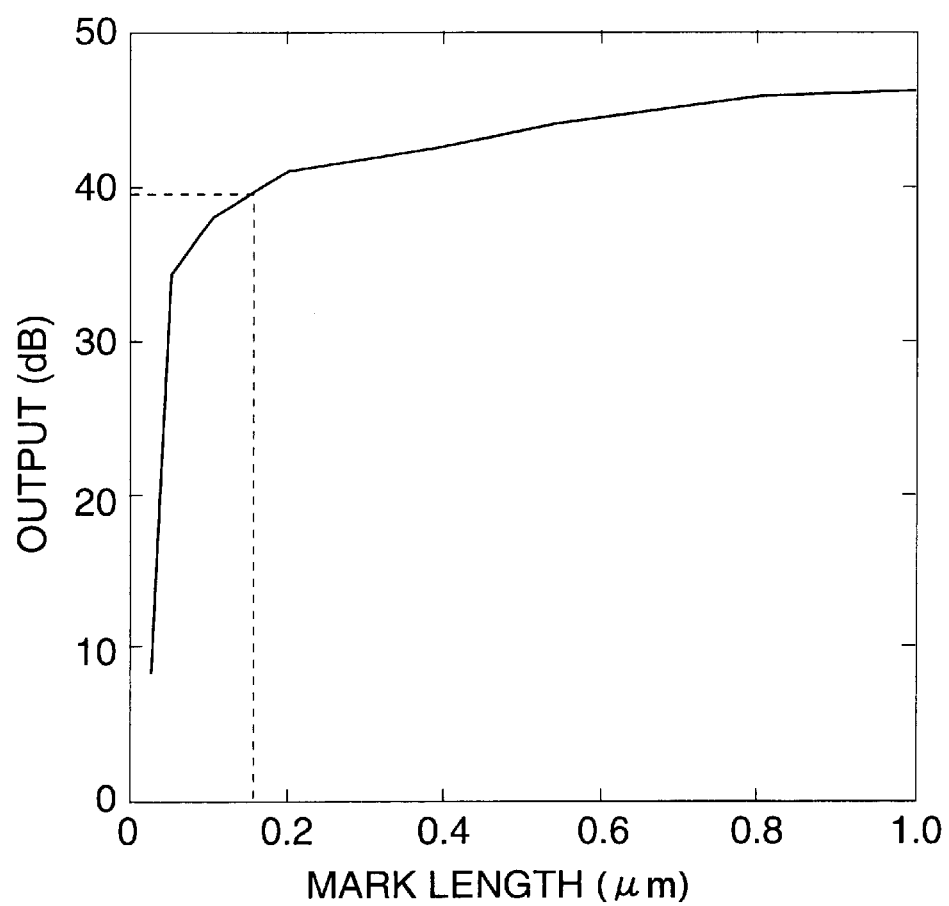
FIG. 3 is a diagram showing the relation between the mark length of recording pits and the output of reproduction.

The Co—Si oxide thin film 1 in the initial state was irradiated with a 20-mW laser beam so that recording pits were formed therein. Recording pits vary in mark length. FIG. 3 shows the relation between the mark length of recording pits and the reproducing output. This relation was obtained from the C/N ratio which varies depending on the mark length during data reading. It is to be noted from FIG. 3 that the reproducing output is as high as 40 dB for the mark length of 0.19 Mm (190 nm). This indicates that the applied laser beam, which has a beam diameter of 265 nm, can read and write marks 190 nm long.

Figure 4:
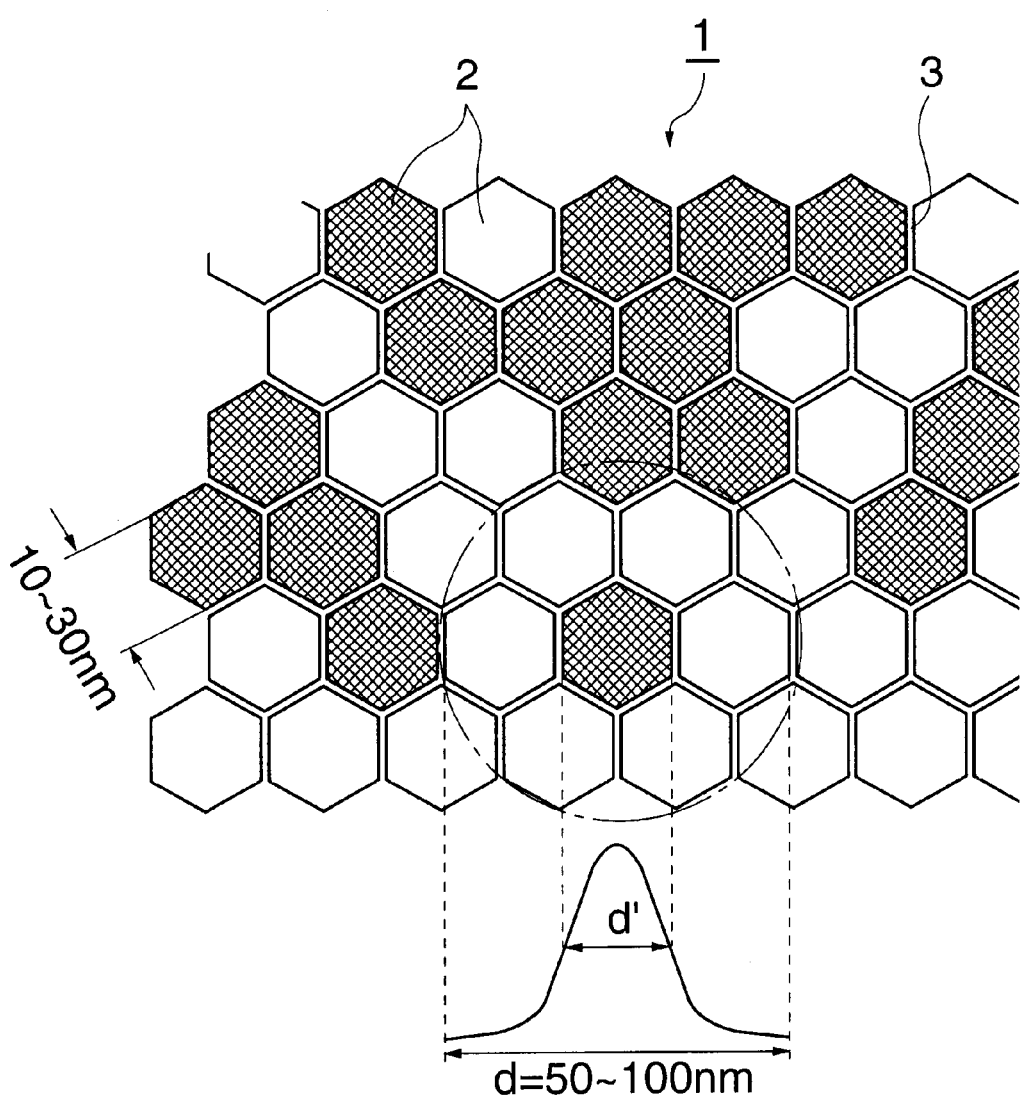
FIG. 4 is a diagraph showing the distribution of laser beam intensity and the range of phase transformation.

According to the present invention, recording pits formed in the Co—Si oxide thin film 1 can be written and read even though their mark length is smaller than the diameter of the laser beam applied. The reason for this is explained in the following. A laser beam has an intensity which varies in space according to the Gaussian distribution, as shown in FIG. 4. Consequently, the intensity is high in the range d' (which is close to the beam center and is smaller than the beam diameter d), and the intensity decreases beyond the range d'. Upon irradiation with a laser beam like this, the Co—Si oxide thin film 1 increases in temperature up to 900° C. (undergoing phase transformation) in the range d' but remains unchanged outside the range d' (without phase transformation). In addition, the Co—Si oxide thin film 1 has the columnar crystals 2 separated by the intergranular phase 3 of $SiO_2$ which has a lower thermal conductivity than the columnar crystals 2. Therefore, heat transfer from one columnar crystal 2 to another is prevented. Moreover, the columnar crystals 2 are separated from one another by the intergranular phase 3, so that the crystalline structure of one columnar crystal 2 does not affect that of the adjacent columnar crystal 2.

Consequently, one columnar crystal 2 which has received energy directly from the laser beam undergoes phase transformation but other columnar crystals remain unchanged. Even though one columnar crystal 2 is over-heated by the laser beam, it does not affect its adjacent columnar crystals 2, so that it is possible to accurately form recording pits whose mark length is smaller than the diameter of the laser beam applied.

Figure 20:
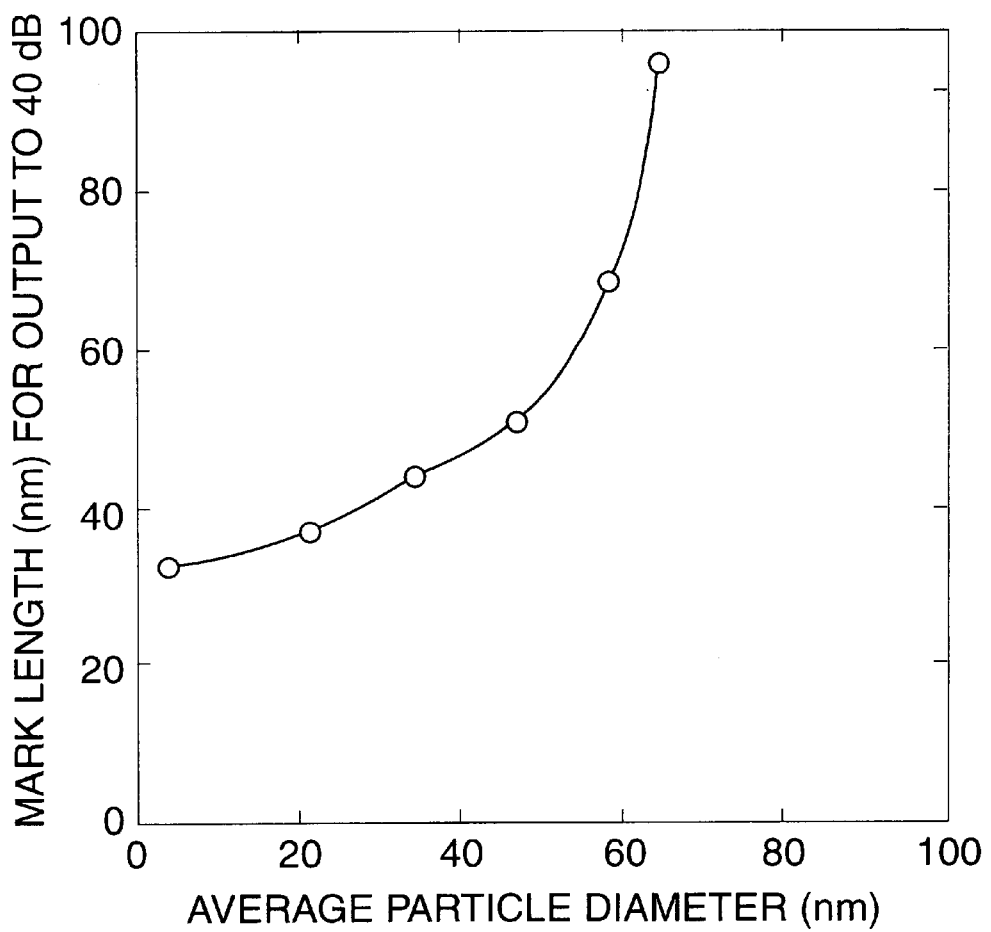
FIG. 20 is a diagram showing the relation between the average particle diameter and the mark length which gives an output higher than 40 dB.

Even in the case where a laser beam having a large beam diameter is used, the resulting recording pits have a mark length smaller than the beam diameter. For example, suppose a case as shown in FIG. 20. That is, there exist a plurality of columnar crystals 2 within the range d' of the laser beam which has an intensity strong enough to bring about phase transformation in the Co—Si oxide thin film 1. In this case, phase transformation takes place within the range d' but does not take place outside the range d'. Heat transfer from the columnar crystals 2 within the range d' to the columnar crystals 2 outside the range d' is prevented by the intergranular phase 3. In addition, the crystalline structure of the columnar crystals 2 within the range d' does not affect the crystalline structure of the columnar crystals 2 outside the range d'. The Co—Si oxide thin film 1 shown in FIG. 1 was actually irradiated with a laser beam having a beam diameter of 265 nm so as to form recording pits having a mark length of 190 nm. The recording pits and their periphery were observed by TEM. It was found that each recording pit is constructed of about 350 columnar crystals 2. In this way it was possible to form accurately recording pits whose mark length is smaller than the diameter of the laser beam applied. In this case each recoding pit is constructed of a plurality of columnar crystals 2, and consequently the recording pit can be accurately read or written even though the recording pit contains a few particles which have not undergone phase transformation.

As mentioned above, the present inventors found the following.
(1) When the Co—Si oxide thin film 1 is irradiated with a laser beam, the columnar crystals 2 undergo phase transformation between $Co_3O_4$ and CoO.
(2) The phase transformation of the columnar crystals 2 can be controlled by adjusting the output of the laser beam applied.
(3) The intergranular phase 3 present at the boundary of the columnar crystals 2 makes it possible to write and read recording pits which are smaller than the beam diameter of the laser beam applied. In view of the fact that crystals change in volume, refractive index, permittivity, and magneto-optical properties upon phase transformation, the present inventors conceived an idea that the Co—Si oxide thin film 1 is suitable for use as a recording film. This idea has led to the present invention in which the Co—Si oxide thin film 1 is used as a recording film for the information recording medium, which is capable of high density recording and is also capable of repeated recording and reproduction.

Figure 21:
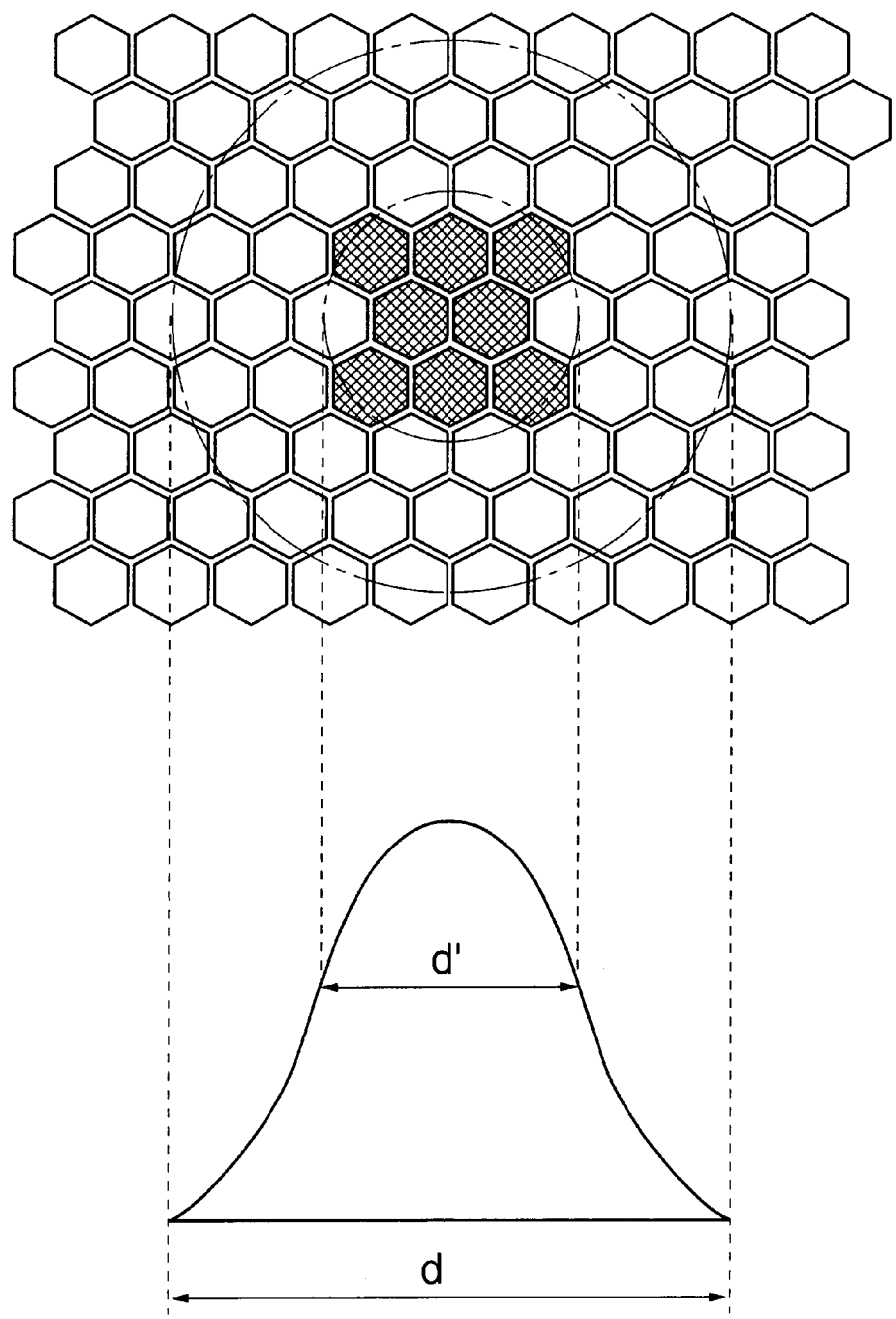
FIG. 21 is a diagraph showing the distribution of laser beam intensity and the range of phase transformation.
Figure 22:
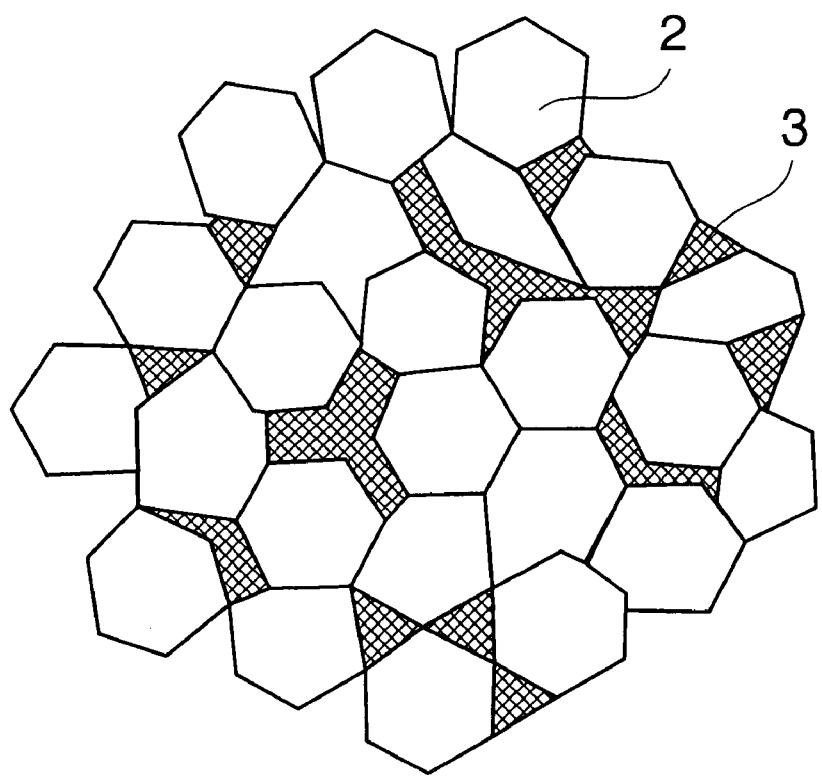
FIG. 22 is a schematic diagram showing a thin film of Co—Si oxide in which the intergranular phase 3 is less liable to precipitation.

The foregoing is about a case in which the intergranular phase 3 surrounds the columnar crystal 2. There exists another case in which the intergranular phase 3 does not surround the columnar crystal 2 completely. In this case, too, the Co—Si oxide thin film 1 can be used as a recording film. In the case where the intergranular phase 3 precipitates partly between adjacent columnar crystals 2 as shown in FIG. 21, the effect of the intergranular phase 3 (such as interruption of heat transfer and interruption of influence on adjacent crystals) is weaker than that in the case where the intergranular phase 2 surrounds the columnar crystal 2 completely. However, such Co—Si oxide thin film 1 can also be used as a recording film because it is possible to form recording pits by utilizing the phase transformation of columnar crystals 2. In this case the mark length of recording pits is longer and the interval between adjacent recording pits is longer and the recording density is lower than in the case where the intergranular phase 3 surrounds the columnar crystal 2 completely.

In the case where the intergranular phase 3 does not exist in the grain boundary of the columnar crystals 2 (as in the case where $Co_3O_4$ accounts for 95–100% of the composition, without Si in the second phase), very little effect of preventing heat transfer between columnar crystals 2 is produced and very little effect of preventing influence of crystal structure is produced. Nevertheless, it is still possible to form recording pits by utilizing the phase transformation of the columnar crystals 2. Therefore, such Co—Si oxide thin film can also be used as a recording film. In this case, however, the mark length of the recording pits is longer and the interval between adjacent recording pits is longer and the recording density is lower.

The more the columnar crystal 2 is surrounded by the intergranular phase 3, the greater the effect of interrupting heat transfer between the columnar crystals 2 and the effect of interrupting the influence of crystalline structure. This leads to a higher recording density. Moreover, the thicker the intergranular phase 3 surrounding the columnar crystal 2, the more the effect of interrupting heat transfer between the columnar crystals 2. This leads to a higher recording density.

It is possible to change the amount or thickness of the intergranular phase 3 which precipitates in the grain boundary of the columnar crystals 2 by adjusting the amount of the Co-containing raw material and the film forming temperature in the process of preparing the Co—Si oxide thin film.

The Co—Si oxide thin film 1 varies in the number of oxygen to combine with Co and hence the columnar crystals 2 undergo phase transformation upon irradiation with a laser beam. The same phase transformation through oxidation and reduction takes place in the oxide film in which Co is replaced by V, Mn, Fe, or Cu. The Si oxide in the intergranular phase may be replaced by any of Ti oxide, Zn oxide, Pb oxide, and Bi oxide, which produce as well the effect of interrupting heat transfer between the columnar crystals 2 and also preventing the influence of crystalline structure.

A detailed description is given below about the information recording medium in which the Co—Si oxide film 1 is used as a recording film.

EXAMPLE 1

Figure 5:
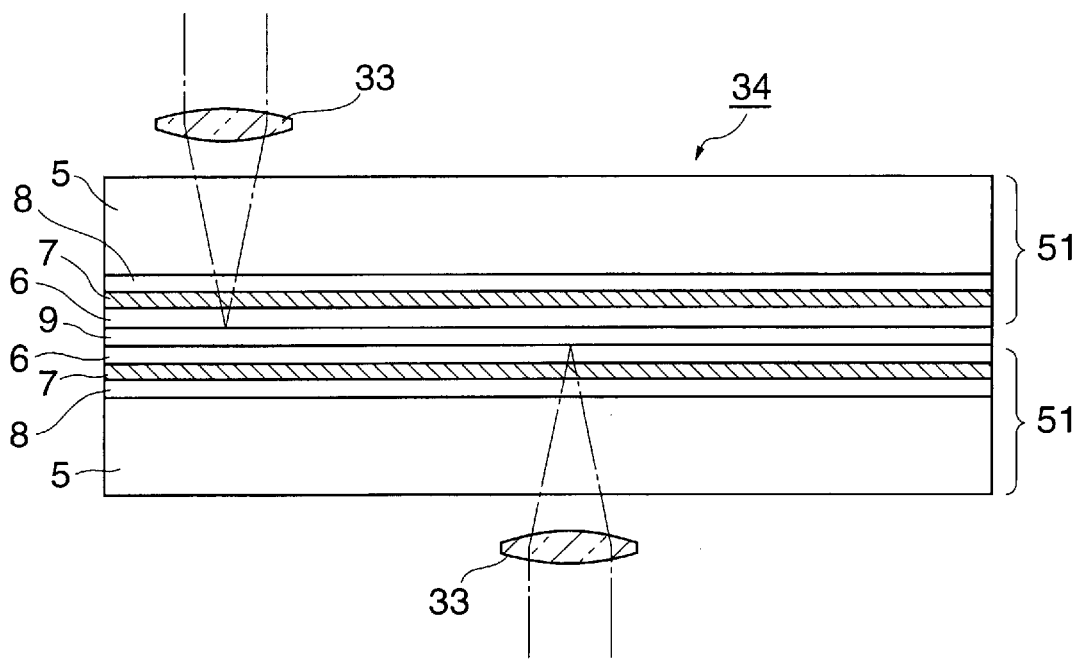
FIG. 5 is a sectional view of the optical disk 34.

This example demonstrates an optical disk 34 which is shown in section in FIG. 5. This optical disk is composed of two glass substrates 5 and two layers each of recording film 7 and reflecting film 6 which are held between the glass substrates 5. The glass substrate 5 is a synthetic quartz glass substrate, 120 mm in diameter and 0.6 mm thick. The glass substrate 5 has a protective film 8 ($SiO_2$ thin film 50 nm thick) formed thereon. On the protective film 8 is formed a recording film 7, which is a Co—Si oxide thin film 50 nm thick. The reflection film 6 is a thin film of Al-3%Ti, 100 nm thick. It is formed on the recording film 7. These films are formed by sputtering. The two glass substrates 5 each having the protective film 8, the recording film 7, and the reflection film 6 on one side thereof are bonded together with a resin 9 such that they face outward.

Figure 6:
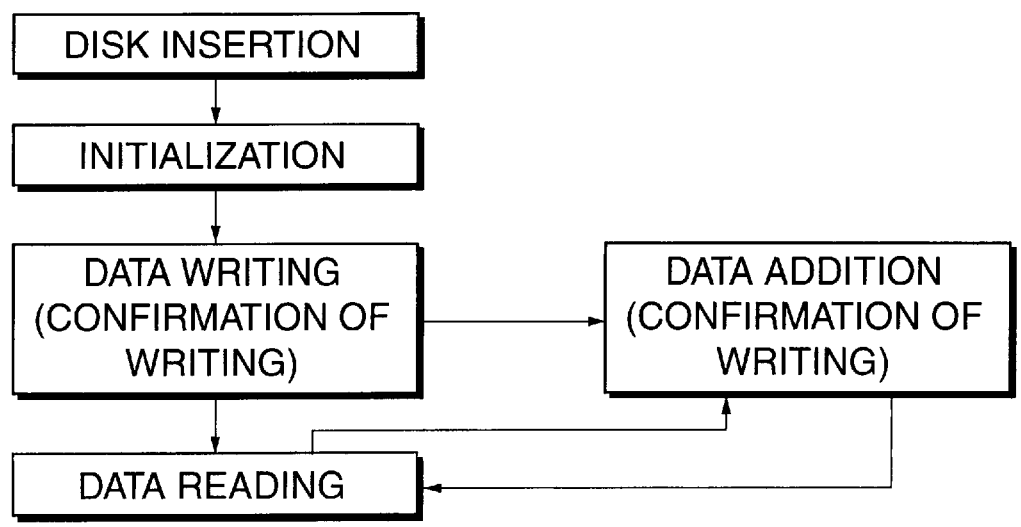
FIG. 6 is a flowchart showing information recording and reproduction.

The optical disk is irradiated with a laser beam emitted from the optical head 33 for information recording and reproduction. FIG. 6 shows a flowchart of information recording and reproduction. At the beginning, the optical disk 34 was initialized by irradiation with a continuous laser beam (with an output $P_E$=6 mW) so that the columnar crystals 2 in the recording film 7 were converted into $Co_3O_4$ completely.

Figure 7:
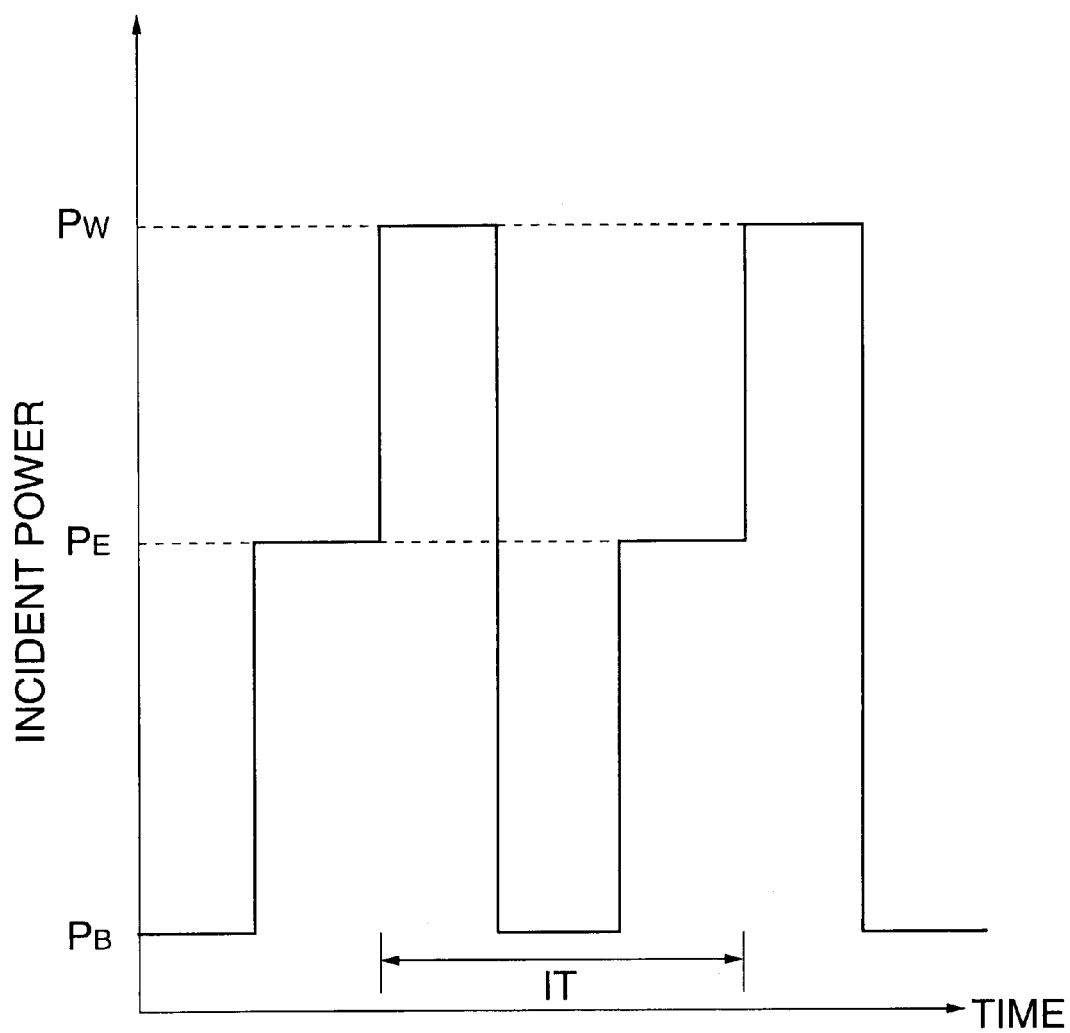
FIG. 7 is a diagram showing the pulse waveform of laser output.

Then, for data writing, the optical disk 34 was irradiated with a laser beam having a pulse waveform as shown in FIG. 7. The laser output $P_W$=6 mW is for information recording. The laser beam with this output heats the columnar crystals 2 to 900° C. or above. The laser output $P_B$=0.5 mW is too small for phase transformation to take place. While the laser beam keeps this low output level, the columnar crystals 2 (which have been heated to 900° C. or above by the laser beam with an output of $P_W$) cool down, with $Co_3O_4$ transforming into CoO. In this way, writing was carried out. The laser beam with an output of $P_B$ that follows the laser beam with an output of $P_W$ permits efficient writing. The laser beam with an output of $P_W$ is preceded by the laser beam with an output of $P_E$ (=6 mW) for erasure, so that previous information is erased and new information is recorded when additional data are recorded.

The mark length of the recording pits is changed according to the number of repetitions of T as one cycle of $P_W$ to $P_E$. A recording pit with the shortest mark length needs 3T's; a recording pit with the longest mark length needs 11–14T's. It is also possible to change the mark length of the recording pit by adjusting the duration of laser output $P_W$ in one period T.

The reproduction of recorded information or the reading of written data is accomplished by irradiating the optical disk with a continuous laser beam having an output of $P_R$=2.0 mW and measuring the variation in intensity of reflected light.

Information recording and reproduction were performed on the optical disk 34 as mentioned above. The optical disk 34 permitted repeated recording and reproduction. It was capable of high-density recording and accurate recording and reproduction.

EXAMPLE 2

Figure 8:
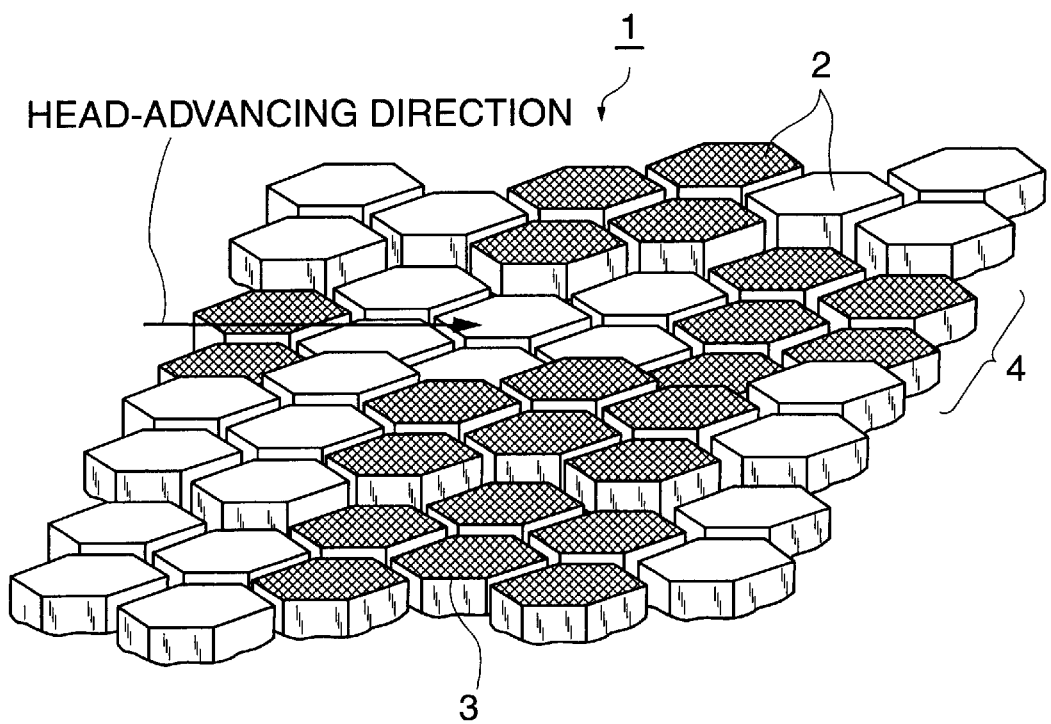
FIG. 8 is a schematic diagram showing the recording film 7 of the optical disk 34.

This example demonstrates the optical disk 34, which differs from the one in Example 1 in that the recording film 7 has a track 4, as shown in FIG. 8. The track 4 was formed by performing photolithography and etching (about 20 nm deep) on the recording film 7. Since the recording film 7 (which is a Co—Si oxide thin film) is composed of columnar crystals 2 which have grown in the direction perpendicular to the surface of the glass substrate, etching proceeds accurately in the direction in which the columnar crystals 2 have grown. Therefore, it was possible to form the track 4 accurately.

Owing to the track 4 formed in the recording film 7, the optical disk 34 in this example can be used as an information recording medium which is built into a storage device or as a portable information recording medium which can be removed from a storage device.

Figure 9:
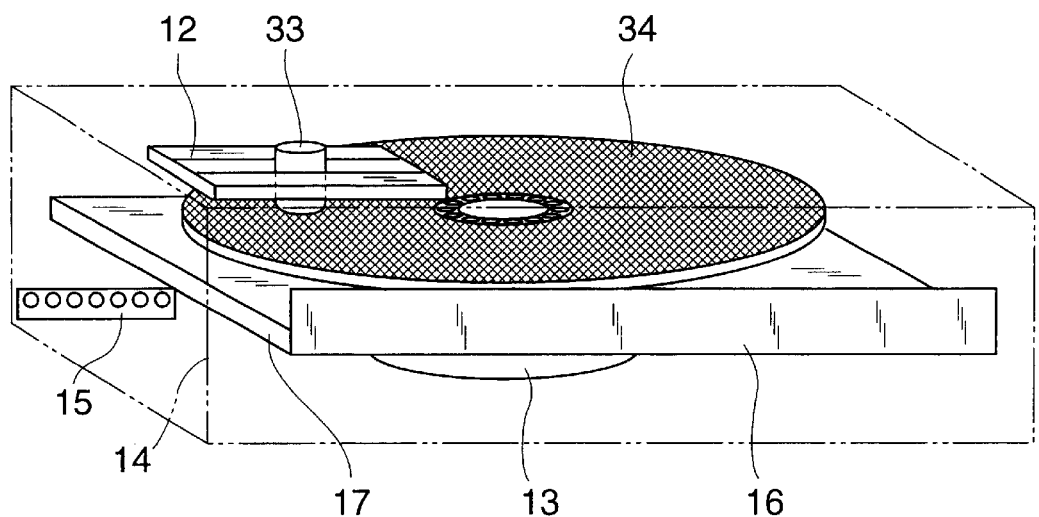
FIG. 9 is a perspective view showing the information recording and reproducing device provided with the optical disk 34.

FIG. 9 shows an information recording and reproducing device provided with the optical disk 34 of this example. The optical disk 34 is inserted into the body 14 through the disk entrance 16. Then, the optical disk 34 is transferred to the spindle motor 13 by the drive unit 17. The spindle motor 13 turns the optical disk 34. The body 14 contains the optical head 33 and the actuator 12 to determine the position of the optical head 33.

In FIG. 9, only one each of the optical head 33 and the actuator 12 are shown; however, two optical heads and two actuators may be mounted on both sides of the optical disk 34 so that recording and reproduction are performed on both sides. Moreover, a plurality of optical heads may be mounted so as to increase the writing and reading speeds.

Incidentally, positioning signals were written and read out at the time of recording and reproduction so as to correct temperature and position. The optical disk 34 in this example was found to have a recording density of 20 Gbit/inch².

The actuator 12 was operated so that the positioning accuracy is within 10% of the beam diameter. This greatly contributed to error reduction at the time of writing and reading. If the positioning accuracy exceeds 10% of the beam diameter, writing and reading errors occur frequently. Therefore, it is desirable that the accuracy of the actuator should be within 10% of the beam diameter with respect to the intended position.

EXAMPLE 3

Figure 10:
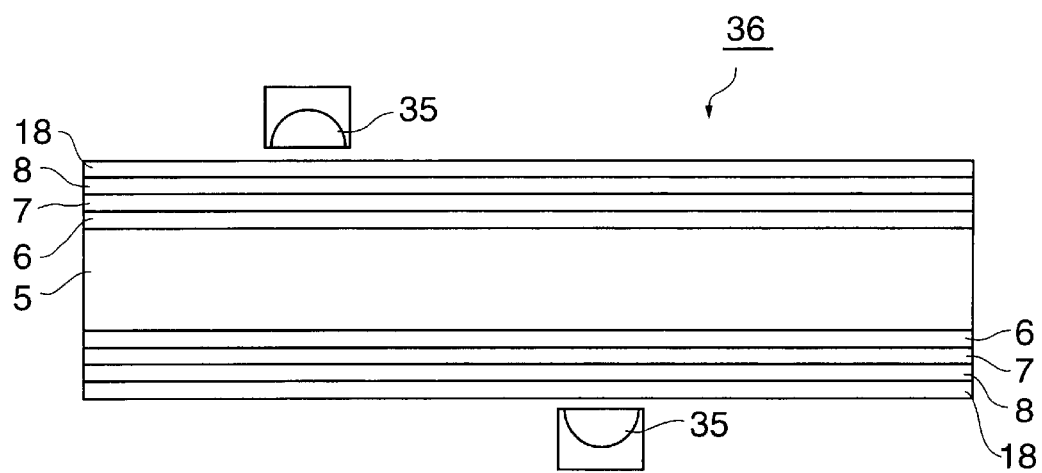
FIG. 10 is a sectional view of the optical disk 36.

This example demonstrates the optical disk 36, which is shown in section in FIG. 10. The optical disk 36 is made up of a glass substrate 5 and the following four layers formed sequentially on each side thereof. Reflection film 6, recording film 7, protective film 8, and lubricant film 18. The glass substrate 5 is a synthetic quartz glass substrate, 120 mm in diameter and 1.2 mm thick. The reflection film 6 is a thin film of Al-3%Ti, 100-nm thick. The recording film 7 is a Co—Si oxide thin film. The protective film 8 is a thin film of $SiO_2$, 50 nm thick. The lubricant film is about 10 nm thick.

Figure 11:
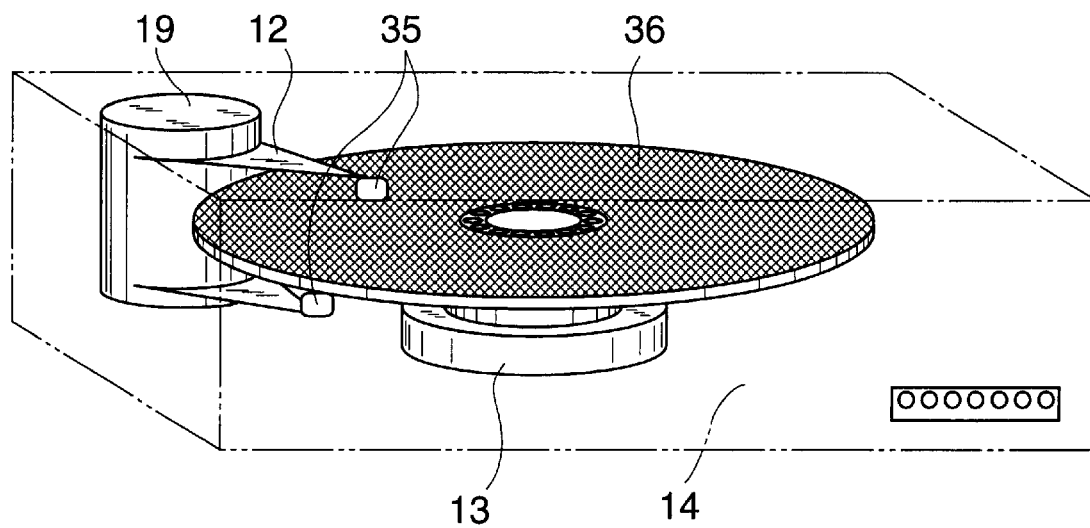
FIG. 11 is a perspective view showing the information recording and reproducing device, with the optical disk 36 mounted.

FIG. 11 shows an information recording and reproducing device provided with the optical disk 36. In the body 14 of the device are mounted a spindle motor 13 to turn the 3 optical disk 36, a actuator to determine the position of the optical head 35, and a VCM coil 19. The optical disk 36 is fixed to the spindle motor 13. The optical head 35 is embedded in a slider made of calcium titanate. The slider is attached to the forward end of the actuator 12.

The device in this example is designed such that information is recorded in and reproduced from the optical disk 36 by using the optical head 35 which emits near-field light. Near-field light is produced by irradiating a semispherical lens with a laser beam so that the laser beam focuses on the circular cross section. The light leaking out from the focal plane is near-field light which has one-tenth the wavelength of the laser beam.

The optical head 35 is equipped with a semispherical lens (FIG. 10). This semispherical lens is irradiated with a laser beam (with a wavelength of 410 nm) so as to give near-field light (125 nmφ)). The optical head 35 was kept at a floating distance of 50 nm from the surface of the optical disk 36, so that the near-field light is applied to the optical disk 36 to make record in the recording film 7.

Figure 12:
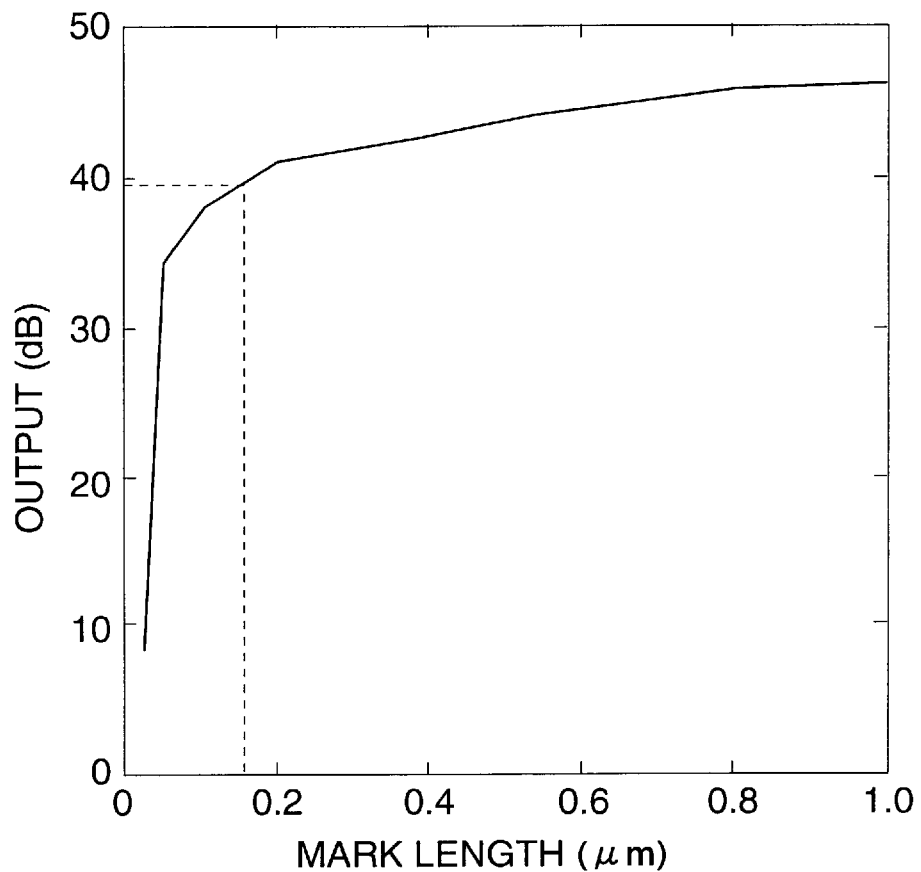
FIG. 12 is a diagram showing the relation between the mark length of recording pits and the output of reproduction which is observed when the optical head 35 emitting near-field light is used.

FIG. 12 shows the relation between the mark length of the recording pit (which was formed by using the optical head 35 to emit the near-field light) and the output of reproduction. It is to be noted that an output of 40 dB was obtained even when the mark length was only 0.083 μm (=83 nm). The recording pit was examined by TEM. It was found to be composed of about 60 columnar crystals 2.

It follows therefore that if the optical head 35 to emit near-field light is used to write and read the optical disk 36, it is possible to accomplish high-density recording and accurate reproduction.

Figure 13:
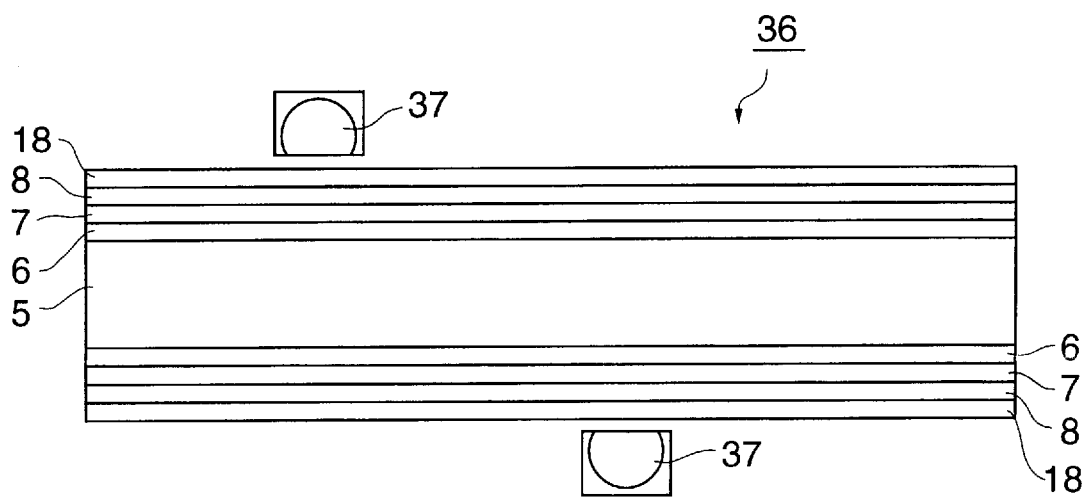
FIG. 13 is another example of the optical head emitting near-field light.
Figure 14:
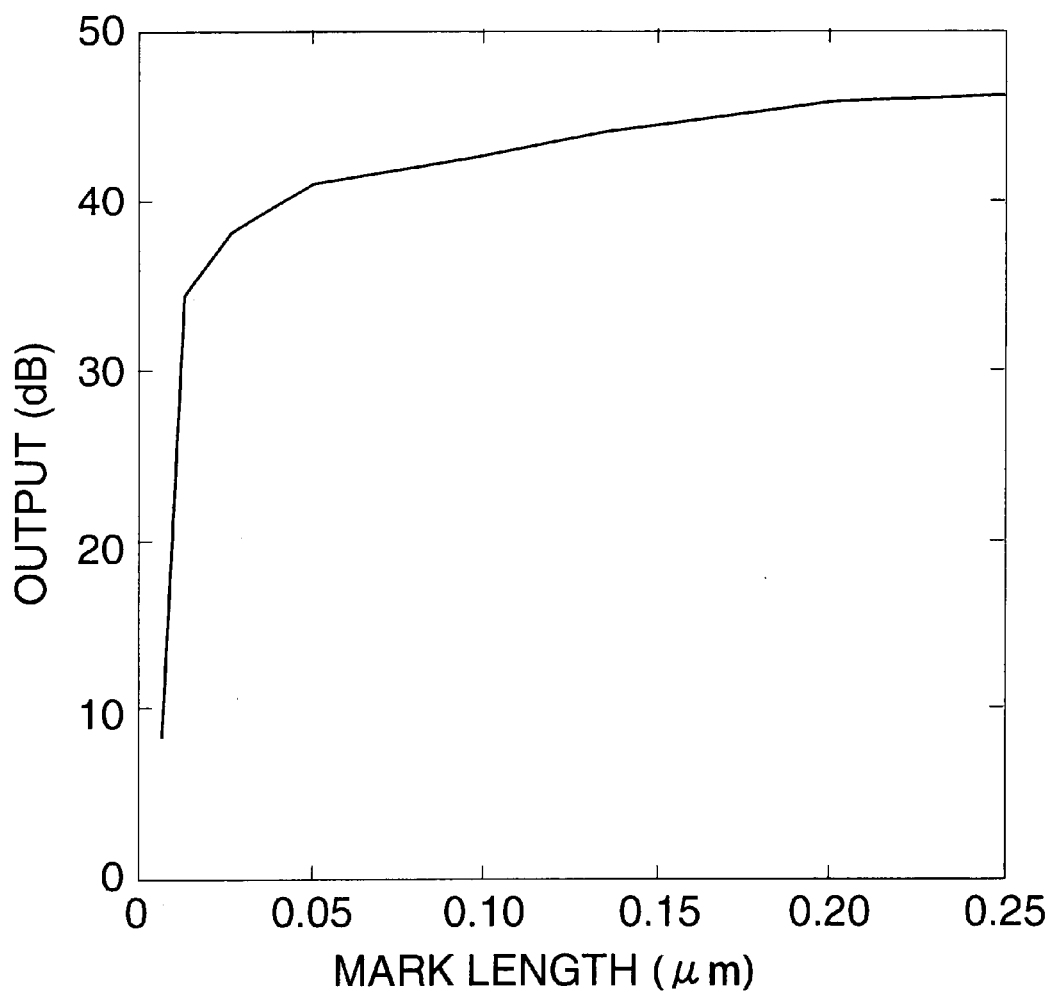
FIG. 14 is a diagraph showing the relation between the mark length of recording pits and the output of reproduction which is observed when the optical head 37 is used.

FIG. 13 shows another example of the optical head to emit near-field light. The optical head 37 is designed such that the cutting plane does not pass through the center of the sphere but it is moved downward a distance of r(1−1/n). The optical head of this structure reduces the laser beam diameter to 52 nm. FIG. 14 shows the relation between the mark length of the recording pit (formed by using the optical head 37) and the output of reproduction. It is to be noted that an output of 40 dB was obtained even when the mark length was only 35 nm. The observation by TEM indicated that each recording pit is composed of about 9 particles.

The semispherical lens shown in FIG. 10 and the super-semispherical lens shown in FIG. 13 are made of $TiO_2$ single crystal, and their sliders are made of transparent glass. An optically polished single crystal of $TiO_2$ (in spherical form) was embedded in $SiO_2$—PbO—$Na_2O$ glass having a coefficient of thermal expansion of $50 \times 10^{-7}/°$ C. To seal the lens, glass cullet placed on the lens was heated and fused at about 800° C. After cooling at a rate of 1–2° C./min, the slider surface was polished to give the semispherical lens and super-semispherical lens.

Figure 15A:
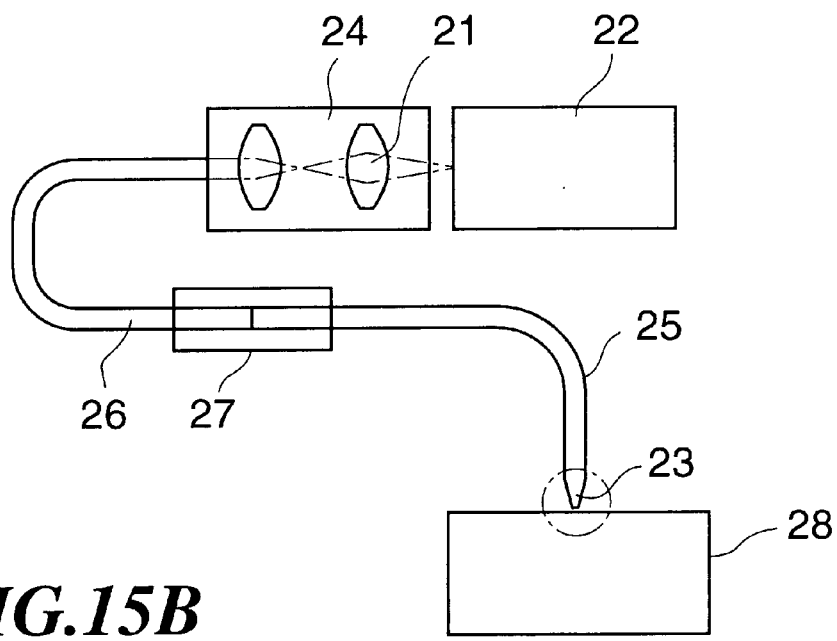
FIG. 15 is another example of the optical head emitting near-field light.
Figure 15B:
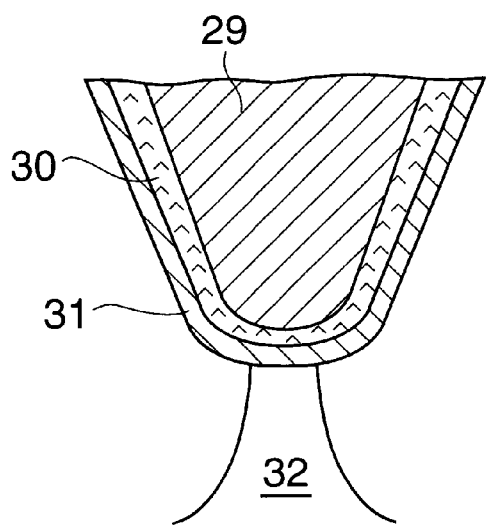

FIG. 15 shows another example of the optical head to emit near-field light. This optical head is designed such that the laser source 22 emits a laser beam 21, which passes through the coupler 24 (aspherical lenses) and the probe fiber 25. The probe fiber 25 is connected to a near-field light probe 23, which is covered with protective films 30 and 31. The tip 29 of the near-field probe 23 emits a small amount of probe light 32.

Figure 16:
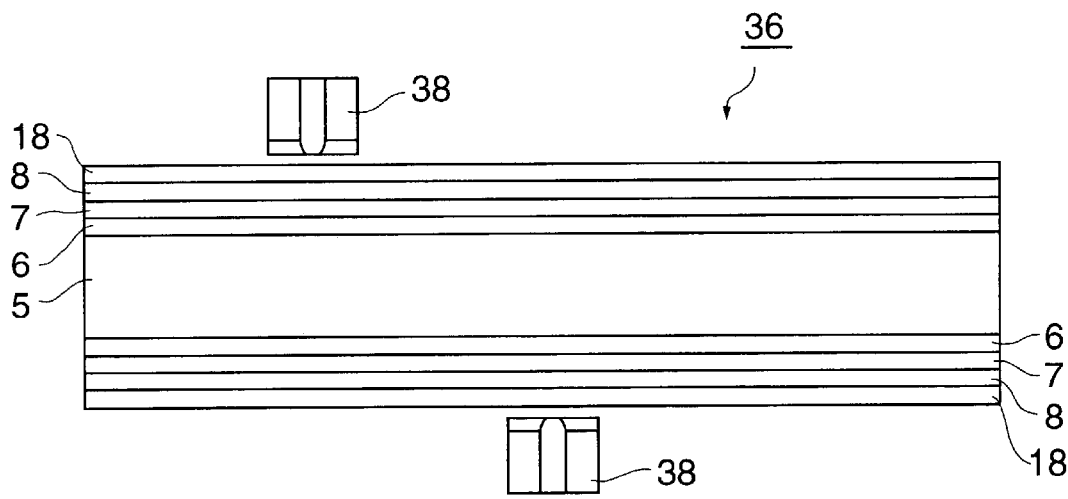
FIG. 16 is another example of the optical head emitting near-field light.
Figure 17:
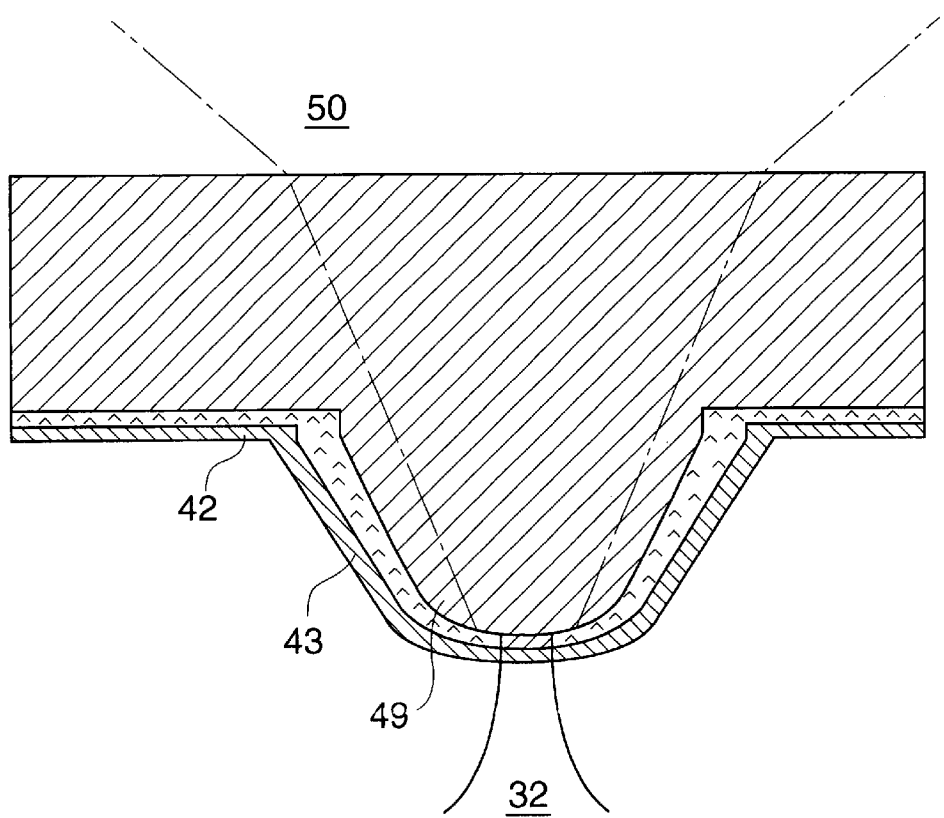
FIG. 17 is a diagram showing the optical head 38.

FIG. 16 shows another example of the optical head to emit near-field light. This optical head 38 is of fiber type, with the near-field light lens is mounted on the slider. FIG. 17 shows the optical head 38. The slider 41 is made of transparent glass. The convex probe tip 49 (shown n FIG. 15) is formed in the slider. The outer surface is covered with protective films 42 and 43. The laser beam 50 entering the probe tip 49 emits a small amount of probe light from the tip 60 of the optical head 38.

Figure 18:
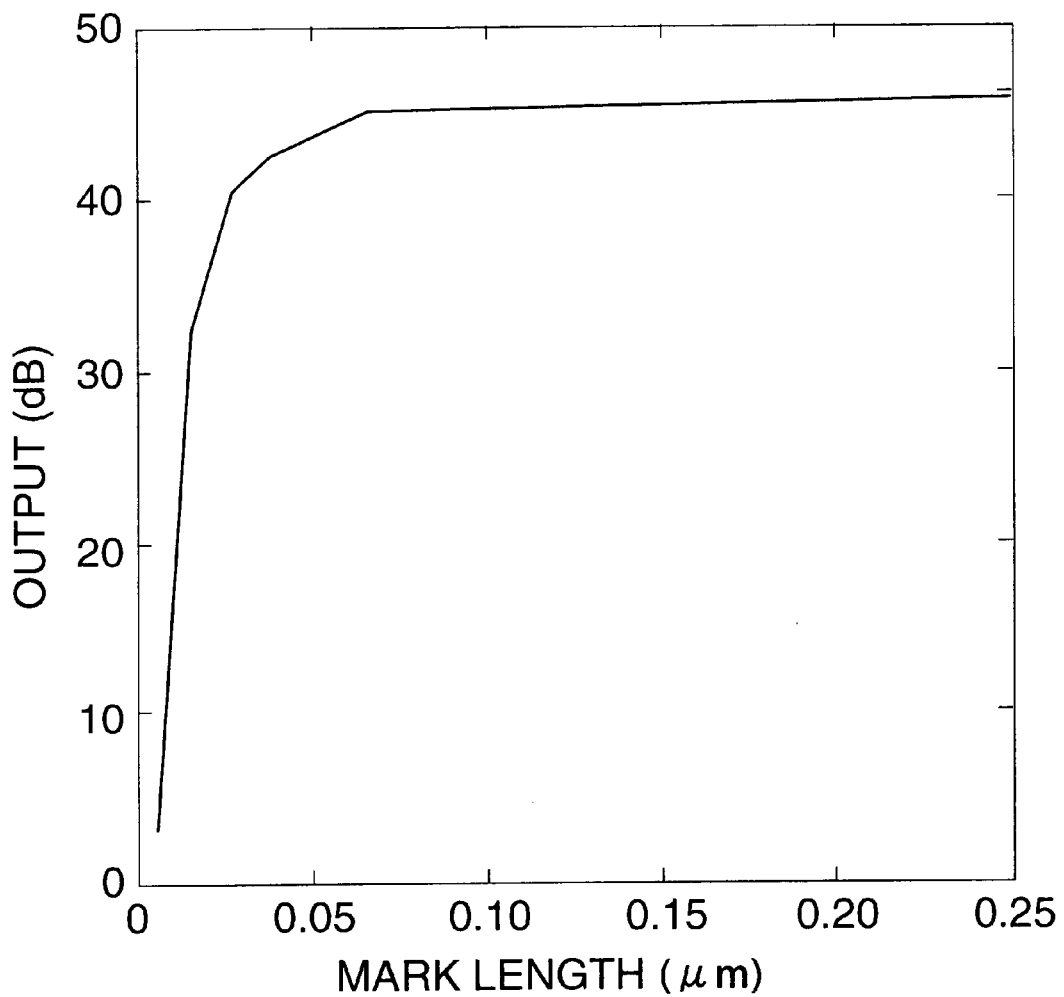
FIG. 18 is a diagraph showing the relation between the mark length of recording pits and the output of reproduction which is observed when the optical head 37 is used.

FIG. 18 shows the relation between the mark length of the recording pit (which was formed by using the optical head 38) and the output of reproduction. It is to be noted that the minimum mark length of the recording pit to give an output of 40 dB is 40 nm. Observation by TEM revealed that each recording pit is composed of 15 particles on average.

EXAMPLE 4

Figure 19:
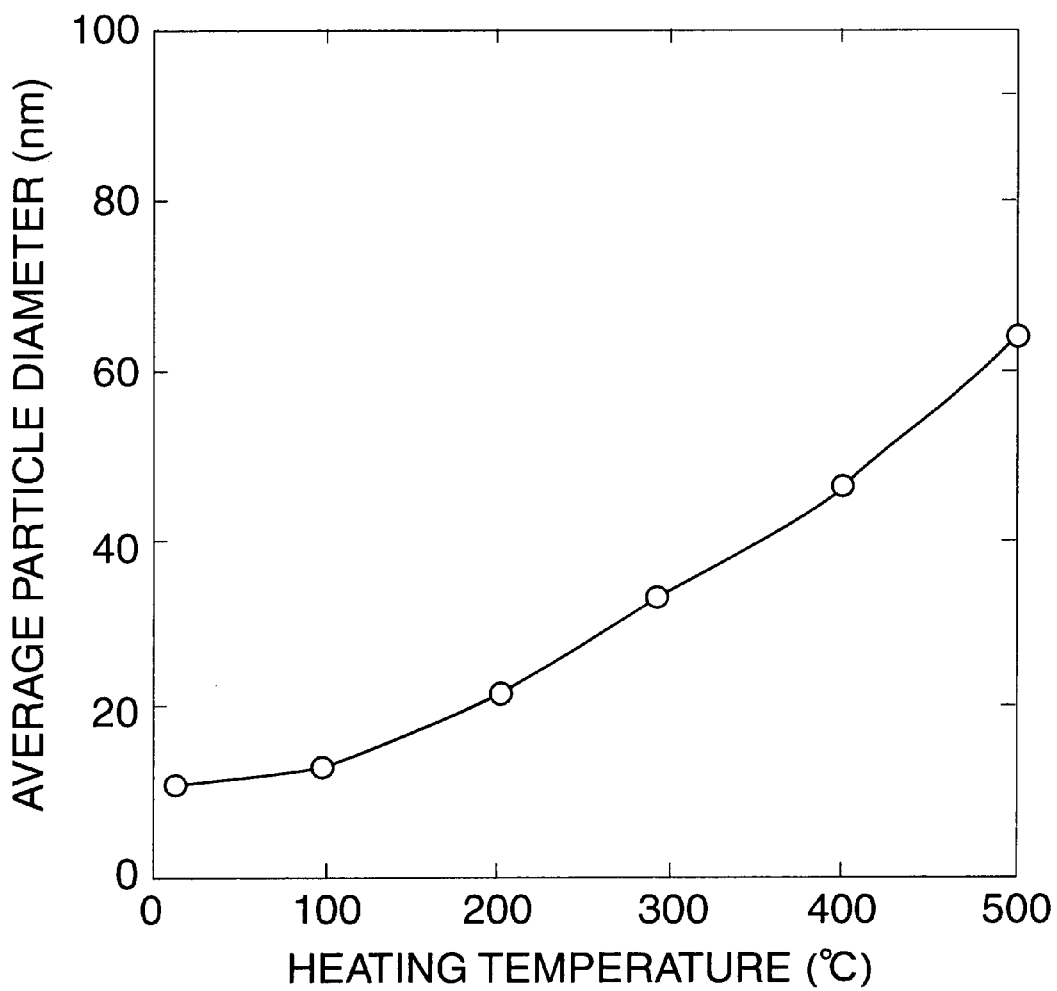
FIG. 19 is a diagram showing the relation between the heating temperature of the substrate and the average particle diameter.

This example is intended to find the particle diameter of the columnar crystals 2 which is most suitable for the recording film 7. The particle diameter was adjusted by heating the substrate under varied conditions at the time of film formation. FIG. 19 shows the relation between the substrate heating temperature and the average particle diameter. It is to be noted that the average particle diameter increases (up to about 62 nm) as the heating temperature increases (up to 500° C.).

The Co—Si oxide thin film 1 in the initial state was irradiated with a laser beam, so that recording pits varying in mark length were formed. FIG. 20 shows a relation between the average particle diameter and the mark length for output greater than 40 dB. The larger the average particle diameter, the larger the mark length for output greater than 40 dB. In other words, as the average particle diameter increases, the recording film becomes less suitable for high-density recording. If a recording density of 20 Gbit/$inch^2$ is to be obtained, it is necessary that the average particle diameter should be smaller than 50 nm. When the average particle diameter exceeds 50 nm, the recording film presents difficulties in writing and reading with a small pit diameter and high output.

It is possible to reduce the average particle diameter if the film is formed over a long time with a low sputtering output. With this method, it is still very difficult to have an average particle diameter smaller than 5 nm (immediately after film formation) and it is difficult to form the film in a stable manner.

It is concluded from the foregoing that if a recording film is to be capable of high density recording, the crystals in the recording film should have an average particle diameter larger than 5 nm and smaller than 50 nm.

It is also possible to change the particle diameter and particle diameter distribution of crystal particles if the sputtering gas pressure is properly varied. Several samples of the Co—Si oxide thin film 1 were prepared which vary in particle diameter distribution, with the average particle diameter kept almost constant at 30 nm. The samples were tested to see the relation between the standard deviation ($\sigma$) of particle diameters and the output at a mark length of 0.05 Mm.

If the standard deviation ($\sigma$) is 3 nm or smaller than 10% of the average particle diameter, it is possible to keep the output of reproduction at 35 dB. However, if the standard deviation ($\sigma$) exceeds 10% of the average particle diameter, the output greatly decreases to about 10 dB. Therefore, it is desirable that the standard deviation ($\sigma$) of particle diameters should be smaller than 10% of the average particle diameter.

EXAMPLE 5

This example demonstrates several samples of recording film other than the Co—Si oxide thin film 1. The intergranular phase was formed from $SiO_2$, and the crystalline particles were formed from an oxide of Ti, V, Cr, Mn, Fe, Ni, or Cu.

Ti oxide gave an amorphous film, which contained no columnar crystals immediately after film formation. Other oxides gave an aggregate of columnar fine crystals as in the case of Co—Si oxide thin film 1. Oxides of V, Mn, Fe, and Cu gave a film which changed in crystalline phase after irradiation with a laser beam. Therefore, the film permits information recording. By contrast, oxides of Cr and Ni gave a film which did not change in crystalline phase after irradiation with a laser beam (20 mW). So, the film does not permit information recording.

Samples of thin films were prepared, in which the crystalline phase is Co oxide and the intergranular phase is $TiO_2$, ZnO, $SiO_2$—PbO glass, or $SiO_2$—$Bi_2O_3$ glass, in place of $SiO_2$. All of them have the same microstructure as that of the Co—Si oxide thin film 1 shown in FIGS. 1 and 2. They permit reading at a high C/N ratio for mark lengths as small as 0.05 $\mu$m.

The foregoing suggests that the recording film should preferably be made of at least one member of Co, V, Mn, Fe, and Cu for the crystalline phase and at least one member of Si, Ti, Zn, Pb, and Bi for the intergranular phase.

The film as an aggregate of hexagonal columnar crystals may have the alumite structure formed on the aluminum surface. The alumite structure is such that particles have a hole at the center and hence particles scatter the laser beam applied to them. By contrast, the oxide film in this example has structure such that particles are solid and particles do not scatter (or diffuse) the laser beam applied to them. Therefore, the oxide film is suitable for use as an information recording medium.

Table 1 shows the oxide recording films investigated in this example. The phase before and after irradiation with a laser beam was examined by TEM and XRD. "Transition laser power" is the laser power required to bring about phase transition and to make recording. "Transition temperature" was calculated backward from the laser power which had bring about phase transition.

TABLE 1

| Element | Immediately after film formation | After irradiation with laser beam | Additive | Transition laser power | Transition temperature |
|---|---|---|---|---|---|
| Co | $Co_3O_4$ | CoO | $SiO_2$ | 20 mW | 900° C. |
| V | $V_2O_5$ | $V_2O_3$ | $SiO_2$ | 15 mW | 690° C. |
| Mn | $Mn_2O_3$ | $Mn_3O4$ | $SiO_2$ | 21 mW | 940° C. |
| Fe | $Fe_2O_3$ (γ) | $Fe_2O_3$ (α) | $SiO_2$ | 13 mW | 600° C. |
| Cu | CuO | $Cu_2O$ | $SiO_2$ | 25 mW | 1026° C. |

The oxide incorporated with $SiO_2$ as an additive gave films having the same structure as that of the Co—Si oxide thin film 1 shown in FIGS. 1 and 2. Therefore, these oxide films are also suitable for use as a recording film. They are capable of repeated recording and reproduction. Thus it is possible to obtain an information recording medium for extremely high density recording.

The information recording medium according to the present invention is characterized in that crystalline particles undergo phase transition in a range smaller than the beam diameter (at the beam center) and the intergranular phase prevents crystalline particles from affecting adjacent crystalline particles. Therefore, it accurately forms recording pits whose mark length is smaller than the laser beam diameter and permits extremely high density recording.

The information recording device according to the present invention is characterized in that the optical head emits a laser beam with a small beam diameter, so that the phase transformation of crystalline particles takes place in a small region, permitting recording pits with small mark length to be formed accurately. In addition, the intergranular phase prevents crystalline particles from affecting adjacent columnar crystals. This leads to high density recording and accurate reproduction.

What is claimed is:

1. An optical information recording medium comprising a recording film capable of information recording and reproduction by means of a laser beam, wherein said recording film has a plurality of crystalline particles comprising Co oxide and an intergranular phase present at the boundary between said crystalline particles, wherein said crystalline particles have an average particle diameter of 5–50 nm, and a standard deviation of particle diameters is 10% or less of the average particle diameter.

2. An optical information recording medium as defined in claim 1, wherein said intergranular phase contains Si oxide.

3. An optical information recording medium as defined in claim 1, wherein said crystalline particles, upon irradiation with said laser beam, undergo phase transformation between $Co_3O_4$ and CoO.

4. An optical information recording medium having a recording film capable of information recording by means of a laser beam, characterized in that said recording film has a plurality of crystalline particles which undergo phase transformation between $Co_3O_4$ and CoO, wherein said crystalline particles have an average particle diameter of 5–50 nm, and a standard deviation of particle diameters is 10% or less of the average particle diameter.

5. An optical information recording medium as defined in claim 4, wherein said recording film has $SiO_2$ in the boundary between said crystalline particles.

6. An optical information recording device which comprises a recording film and an optical head, said recording film being capable of information recording and reproduction by means of a laser beam and being composed of a plurality of crystalline particles comprising Co oxide and an intergranular phase present in the boundary between said crystalline particles, said optical head supplying said recording film with near-field light so processed as to have a diameter smaller than the wavelength of said laser beam, wherein said crystalline particles have an average particle diameter of 5–50 nm, and a standard deviation of particle diameters is 10% or less of the average particle diameter.

7. An optical information recording device as defined in claim 6, wherein said intergranular phase contains Si oxide.

8. An optical information recording device as defined in claim 6, wherein said crystalline particles, upon irradiation with said laser beam, undergo phase transformation between $Co_3O_4$ and CoO.

* * * * *